(12) United States Patent
Ikeda

(10) Patent No.: US 9,538,642 B2
(45) Date of Patent: Jan. 3, 2017

(54) WIRING BOARD AND METHOD FOR MANUFACTURING THE SAME

(71) Applicant: IBIDEN CO., LTD., Ogaki-shi (JP)

(72) Inventor: Kosuke Ikeda, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/202,324

(22) Filed: Mar. 10, 2014

(65) Prior Publication Data

US 2014/0251656 A1 Sep. 11, 2014

(30) Foreign Application Priority Data

Mar. 8, 2013 (JP) .................. 2013-047079

(51) Int. Cl.
| | | |
|---|---|---|
| *H05K 1/02* | (2006.01) | |
| *H05K 1/03* | (2006.01) | |
| *H05K 3/46* | (2006.01) | |
| *H05K 3/38* | (2006.01) | |

(52) U.S. Cl.
CPC .......... *H05K 1/0298* (2013.01); *H05K 1/0296* (2013.01); *H05K 1/0373* (2013.01); *H05K 3/4644* (2013.01); *H05K 3/4676* (2013.01); *H05K 3/381* (2013.01); *H05K 3/4682* (2013.01); *Y10T 29/49117* (2015.01)

(58) Field of Classification Search
CPC ................ H05K 1/0298; H05K 3/4694; H05K 2201/10159; H01L 24/14; H01L 24/18
USPC ................................................. 174/251–257
See application file for complete search history.

(56) References Cited

U.S. PATENT DOCUMENTS

| | | | |
|---|---|---|---|
| 2009/0229868 A1* | 9/2009 | Tsukada .............. | H05K 3/4661 174/258 |
| 2012/0067632 A1 | 3/2012 | Nakai et al. | |
| 2012/0152599 A1* | 6/2012 | Kitagawa .............. | H05K 3/381 174/257 |
| 2012/0211370 A1* | 8/2012 | Nakai .................... | C25D 5/022 205/122 |

FOREIGN PATENT DOCUMENTS

| | | |
|---|---|---|
| CN | 1106606 A | 5/1995 |
| CN | 101321437 A | 12/2008 |
| CN | 102333823 A | 1/2012 |
| CN | 102484951 A | 5/2012 |
| CN | 102754031 A | 10/2012 |
| JP | 9-232756 A | 9/1997 |
| JP | 2004-277728 | 10/2004 |

* cited by examiner

*Primary Examiner* — Ishwarbhai B Patel
*Assistant Examiner* — Rockshana Chowdhury
(74) *Attorney, Agent, or Firm* — Oblon, McClelland, Maier & Neustadt, L.L.P.

(57) ABSTRACT

A wiring board includes a core structure including a core substrate, and a buildup structure formed on the core structure and including an interlayer insulating layer and a conductive layer. The interlayer insulating layer does not contain inorganic fiber and includes a resin and an inorganic filler, and the conductive layer is formed on the interlayer insulating layer such that the inorganic filler in the interlayer insulating layer is not in contact with the conductive layer.

20 Claims, 6 Drawing Sheets

WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-047079, filed Mar. 8, 2013, the entire contents of which are incorporated herein by reference.

BACKGROUND OF THE INVENTION

Field of the Invention

The present invention relates to a wiring board and a method for manufacturing the same.

Description of Background Art

JP 2004-277728 A describes a wiring board with an interlayer insulating layer that does not contain an inorganic fiber base material. The entire contents of this publication are incorporated herein by reference.

SUMMARY OF THE INVENTION

According to one aspect of the present invention, a wiring board includes a core structure including a core substrate, and a buildup structure formed on the core structure and including an interlayer insulating layer and a conductive layer. The interlayer insulating layer does not contain inorganic fiber and includes a resin and an inorganic filler, and the conductive layer is formed on the interlayer insulating layer such that the inorganic filler in the interlayer insulating layer is not in contact with the conductive layer.

According to another aspect of the present invention, a wiring board includes an insulating layer, a first conductive layer formed on a first surface of the insulating layer, a second conductive layer formed on a second surface of the insulating layer on the opposite side of the insulating layer with respect to the first surface, and a via conductor structure formed through the insulating layer such that the via conductor structure is connecting the first conductive layer and the second conductive layer. The insulating layer does not contain inorganic fiber and includes a resin and an inorganic filler, and the first conductive layer is formed on the insulating layer such that the inorganic filler in the insulating layer is not in contact with the first conductive layer.

According to yet another aspect of the present invention, a method for manufacturing a wiring board includes forming a core structure including a core substrate, and forming on the core structure a buildup structure including an interlayer insulating layer and a conductive layer. The forming of the buildup structure includes forming the interlayer insulating layer which does not contain inorganic fiber and includes a resin and an inorganic filler such that the interlayer insulating layer forms a surface which does not have the inorganic filler and forming the conductive layer on the surface of the interlayer insulating layer such that the inorganic filler in the interlayer insulating layer is not in contact with the conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
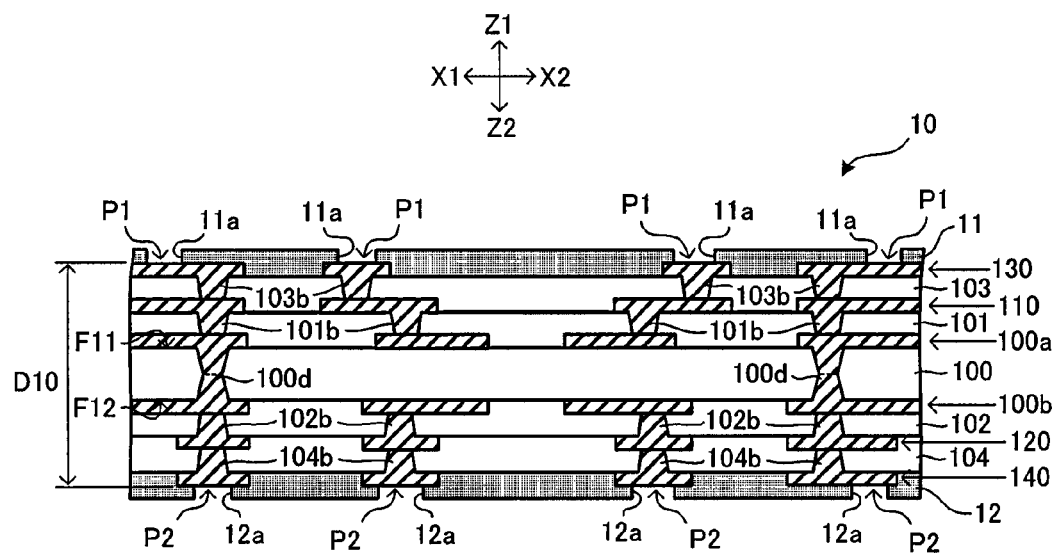
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) indicate lamination directions of a wiring board (or thickness directions of the wiring board) corresponding to a normal line perpendicular to main surfaces (i.e., upper and lower surfaces) of the wiring board, respectively. In addition, arrows (X1, X2) and (Y1, Y2) indicate directions perpendicular to lamination directions (or toward side surfaces of each layer), respectively. The main surfaces of the wiring board are on (X-Y) planes. Side surfaces of the wiring board are on (X-Z) planes or (Y-Z) planes. In a lamination direction, a layer closer to a core is referred to as a lower layer and a layer farther from the core is referred to as an upper layer.

A conductive layer is structured to include one or multiple conductive patterns. A conductive layer may include a conductive pattern, for example, an electric circuit (including ground), a pad, a land and the like, or may include a conductive pattern that does not form an electric circuit.

The term "preparing" includes situations in which materials and components are purchased and manufactured accordingly, as well as situations in which finished products are purchased and used accordingly.

A wiring board 10 according to the present embodiment is a multilayer printed wiring board (double-sided rigid wiring board), for example, as shown in FIG. 1. The wiring board 10 includes a substrate 100, insulating layers (101, 102, 103, 104), conductive layers (100a, 100b, 110, 120, 130, 140), a through-hole conductor (100d), via conductors (101b, 102b, 103b, 104b), and solder-resist layers (11, 12). The wiring board 10 of the present embodiment is a rigid wiring board having a rectangular plate shape on a planar view, for example. The wiring board 10 includes a circuit of an electronic device, for example. An electronic component may be mounted on a surface of or built into the wiring board 10. Hereinafter, one of the upper and lower surfaces (two main surfaces) of the substrate 100 (on the (Z1) side) is referred to as a surface (F11), and the other surface (on the (Z2) side) is referred to as a surface (F12).

The substrate 100 corresponds to a core substrate of the wiring board 10. The conductive layer (100a) is formed on the surface (F11) of the substrate 100, and the conductive layer (100b) is formed on the surface (F12) of the substrate 100. The conductive layers (100a, 100b) are electrically connected to each other by a conductor (through-hole conductor (100d)) formed in the hole made in the substrate 100. In the wiring board 10 of the present embodiment, the substrate 100, the through-hole conductor (100d), and the conductive layers (100a, 100b) correspond to the core section.

In the wiring board 10 according to the present embodiment, the insulating layers (101, 103) (each an interlayer insulating layer) and the conductive layers (110, 130) are alternately formed on the surface (F11) of the substrate 100 and on the conductive layer (100a). Also, the insulating layers (102, 104) (each an interlayer insulating layer) and the conductive layers (120, 140) are alternately formed on the surface (F12) of the substrate 100 and on the conductive layer (100b). The conductive layers are electrically connected by their respective conductors, such as the via conductors (101b, 102b, 103b, 104b) formed in the holes made in the interlayer insulating layer.

The conductive layers and the interlayer insulating layers laminated on the core section along with the via conductors correspond to a buildup section. Hereinafter, the buildup section positioned on the lowermost side is referred to as a lower buildup section, and the buildup section positioned on the upper side of the lower buildup section is referred to as an upper buildup section. In the present embodiment, the lower buildup section includes the insulating layers (101, 102), the conductive layers (110, 120), and the via conductors (101b, 102b). In addition, the upper buildup section includes the insulating layers (103, 104), the conductive layers (130, 140), and the via conductors (103b, 104b).

The solder-resist layer 11 is arranged on the outermost insulating layer 103 and on the outermost conductive layer 130, and the solder-resist layer 12 is arranged on the outermost insulating layer 104 and on the outermost conductive layer 140. Openings (11a, 12a) are respectively formed in the solder-resist layers (11, 12), and the conductive layers (130, 140) respectively exposed in the openings (11a, 12a) serve as pads (P1, P2) (external connection terminals). When another wiring board or electronic component is mounted on one surface or both surfaces of the wiring board 10, the wiring board 10 can be used, for example, as a circuit board of a portable device (mobile phone or the like). The wiring board 10 of the present embodiment is a package substrate (PKG substrate) with one surface on which to mount electronic component (IC chip or the like) and the opposite surface on which bumps for mounting a motherboard are formed, for example. In addition, a PoP (Package on Package) technique may be applied to the wiring board 10.

The conductors (conductive layers, via conductors, and through-hole conductors) of the wiring board 10 are each made of copper, for example. The through-hole conductors and via conductors are each a conductor filled with plating. However, that is not the only option, and any other material may be used for the conductors of the wiring board 10. The through-hole conductors and via conductors may each be a conformal conductor, which is not filled with plating, for example.

The insulating layers (core substrate and interlayer insulating layers) of the wiring board 10 are each formed of a thermosetting epoxy-based resin, for example. It is noted that the substrate 100 (core substrate) is formed by impregnating glass cloth (inorganic fiber) with an epoxy-based resin. On the other hand, the insulating layers (101, 102, 103, 104) (each an interlayer insulating layer) do not contain inorganic fiber. Inorganic fiber (base material) of the substrate 100 is not limited to glass cloth, and may be a nonwoven fabric of aramid fiber or the like. In addition, the resin of the substrate 100 and the insulating layers (101, 102, 103, 104) is not limited to an epoxy-based resin, and may be a polyimide-based resin, a BT resin, an allylated phenylene ether resin (A-PPE resin), an aramid resin, a liquid crystal polymer (LCP), a PEEK resin, a PTFE resin (fluororesin), or the like.

In the present embodiment, the substrate 100 (core substrate) is formed by impregnating glass cloth (inorganic fiber) with epoxy-based resin containing an inorganic filler. The content of the inorganic filler in the resin is within a range of 40 to 70 wt %, for example. As the inorganic filler, it is preferable to use silica-based filler (dissolved quartz, isotropic silica, silica, talc, mica, kaolin, calcium silicate, and the like), for example. However, the present embodiment is not limited to the above, and it is an option for the substrate 100 not to contain an inorganic filler.

In the present embodiment, each of the insulating layers (101, 102, 103, 104) (interlayer insulating layers) contains an inorganic filler. The content (rate) of an inorganic filler in each insulating layer is preferably within a range of 50 to 80 wt %. The diameter of the inorganic filler is within a range of 0.05 to 5.0 μm, and a mean particle size thereof is 0.5 μm. For example, the inorganic filler in each of the insulating layers (101, 102, 103, 104) is not distributed uniformly (a detailed description is provided later).

The solder-resist layers (11, 12) are each made of a photosensitive resin containing an acrylic epoxy-based resin, a thermosetting resin mainly containing an epoxy-based resin, or a UV-curable resin.

In FIG. 1, a thickness (D10) of the wiring board 10 is about 300 μm, for example. A thickness of each conductive layer is about 15 μm, for example. A thickness of each interlayer insulating layer is about 20 μm, and a thickness of the substrate 100 is about 150 μm, for example. A thickness of each of the solder-resist layers (11, 12) is within a range of 13 to 25 μm.

In the following, the interlayer insulating layer of the wiring board 10 according to the present embodiment is described in detail, with reference to FIGS. 2 to 3B.

Figure 2:
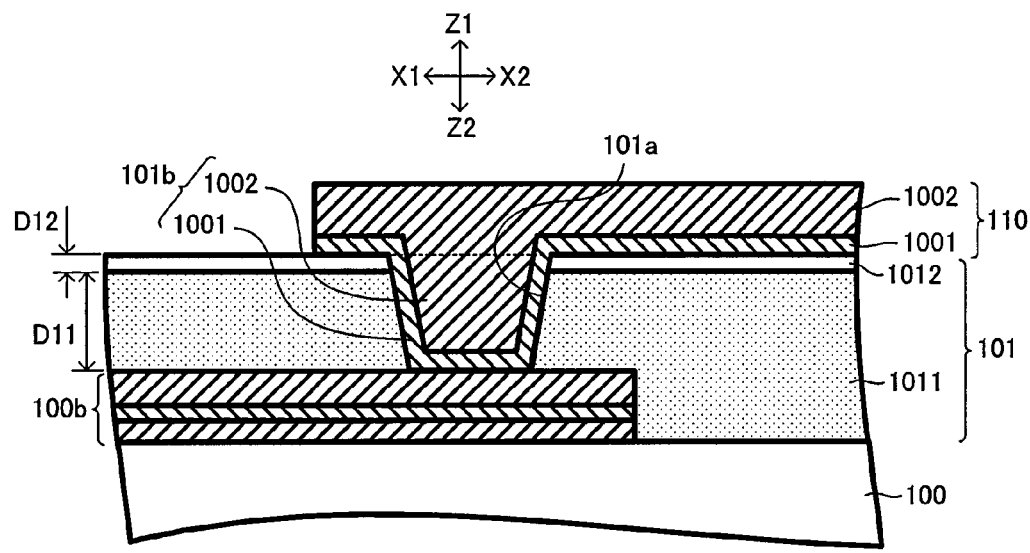
FIG. 2 is an enlarged cross-sectional view showing a via conductor and its vicinity of the wiring board in FIG. 1.

FIG. 2 is an enlarged cross-sectional view showing the via conductor (101b) and its vicinity of the wiring board 10 shown in FIG. 1.

In the wiring board 10 according to the present embodiment, the conductive layer 110 is formed on the insulating layer 101 (interlayer insulating layer) as shown in FIG. 2. In addition, the via conductor (101b) connects the conductive layer 110 and the conductive layer (100b), which is formed under the conductive layer 110. The conductive layer 110 and the via conductor (101b) can be formed by performing electroless plating and electrolytic plating when a via hole (101a) for the via conductor (101b) is formed in the insulating layer 101, for example. The conductive layer 110 and the via conductor (101b) are each made of an electroless copper-plated film 1002 (a lower layer), for example, and an electrolytic copper-plated film 1001 (an upper layer), for example.

Figure 3A:
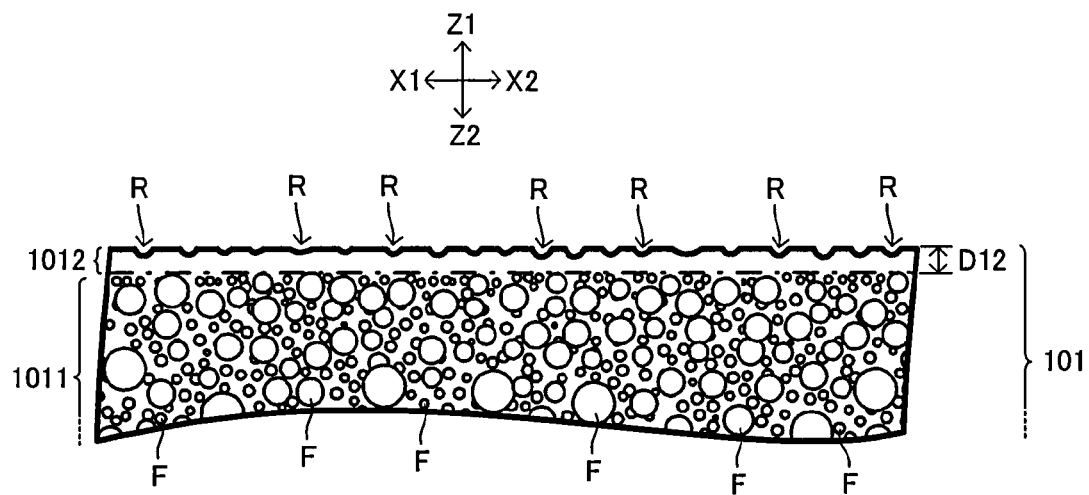
FIG. 3A is a cross-sectional view showing the distribution of an inorganic filler contained in an interlayer insulating layer of the wiring board in FIG. 1.

FIG. 3A is a cross-sectional view showing the distribution of an inorganic filler contained in the insulating layer 101.

In the wiring board 10 according to the present embodiment, as shown in FIG. 3A, the insulating layer 101 (interlayer insulating layer) is formed with a filler layer 1011 containing an inorganic filler (F) and a resin layer 1012 formed on the filler layer 1011. The conductive layer 110 is formed on the resin layer 1012 (see FIG. 2). In the present embodiment, the resin layer 1012 contains no inorganic filler at all. However, that is not the only option, and the resin layer 1012 may contain an inorganic filler. In such a case, the content (rate) of the inorganic filler contained in the resin layer 1012 is set lower than the content (rate) of the inorganic filler contained in the filler layer 1011. The filler layer 1011 is a portion of the insulating layer 101 that ranges from the upper surface of the substrate 100 to the lower surface of the resin layer 1012, and the resin layer 1012 is a portion of the insulating layer 101 that ranges from the upper surface of the filler layer 1011 to the lower surface of the conductive layer 110.

As the inorganic filler (F) contained in the filler layer 1011, it is preferable to use silica-based filler (dissolved quartz, isotropic silica, silica, talc, mica, kaolin, calcium silicate, or the like), for example. Preferably, the inorganic filler (F) is in a spherical shape.

In the present embodiment, the content (rate) of an inorganic filler in each insulating layer is preferred to be 50 to 80 wt %. When the content (rate) of an inorganic filler is less than 50 wt %, the thermal expansion coefficient increases and warping of a substrate occurs. When the content of the inorganic filler exceeds 80 wt %, adhesion to a conductor pattern decreases. The filler layer 1011 contains an inorganic filler while the resin layer 1012 contains no inorganic filler at all. That is, in the present embodiment, no inorganic filler is contained at all in a surface portion of the insulating layer 101. In addition, the filler layer 1011 contains both smaller inorganic filler (F) and larger inorganic filler (F). The diameter of an inorganic filler particle is in a range of 0.05 to 5.0 µm, and a mean particle diameter thereof is 0.5 µm. However, a small amount of inorganic filler may be present in the resin layer 1012. In such a case, the content of the inorganic filler in the resin layer 1012 is preferred to be no greater than ⅕ the content of the inorganic filler in the filler layer 1011, for example. The content (rate) of the inorganic filler (F) is substantially the same in the entire area of the filler layer 1011, for example.

Preferably, a thickness of the resin layer 1012 is in a range of 0.05 to 1.0 µm. When it is less than 0.05 µm, a large amount of the inorganic filler is exposed on the surface of the insulating layer 101 after roughening treatment is performed. If it exceeds 1.0 µm, it is difficult to form a roughened surface. A thickness of the insulating layer 101 is 20 µm, for example. A thickness (D11) of the filler layer 1011 is within a range of 19.0 to 19.95 µm, for example.

Using a coating method, it is difficult to form such a thin resin layer 1012 described above. Therefore, in the present embodiment, the above-described thin resin layer 1012 is formed through a method that uses resin contraction caused by heating. In the present embodiment, the filler layer 1011 and the resin layer 1012 are not separately formed; after one entire insulating layer is formed, by moving the inorganic filler or resin contained in the insulating layer, the filler layer 1011 and the resin layer 1012 are formed. Therefore, the filler layer 1011 and the resin layer 1012 are contiguous and there is no clear boundary (interface) between the filler layer 1011 and the resin layer 1012.

Many recessed portions (cavities) (R) are formed on the surface (specifically, resin layer 1012) of the insulating layer 101 which is in contact with the insulating layer 103 and the conductive layer 110. The recessed portions (R) are formed over the entire area of the surface (X-Y plane) of the insulating layer 101 as shown in FIG. 3B. An Ra (arithmetic mean roughness) of the surface of the insulating layer 101 (resin layer 1012) on the insulating layer 103 side (or the conductive layer 110 side) is about 0.20 µm, for example. In the present embodiment, since a portion of the upper insulating layer 103 is filled into the recessed portions (R) (see FIGS. 3A and 3B), adhesion is improved between the insulating layer 101 (lower interlayer insulating layer) and the insulating layer 103 (upper interlayer insulating layer). In order to improve the adhesion between the insulating layer 101 and the insulating layer 103, the Ra of the surface of the insulating layer 101 (resin layer 1012) is preferred to be within a range of 0.1 to 0.3 µm. When it is less than 0.1 µm, adhesion to a pattern resist is lowered. When it exceeds 0.3 µm, it is difficult to form wiring with a narrow width.

Figure 3B:
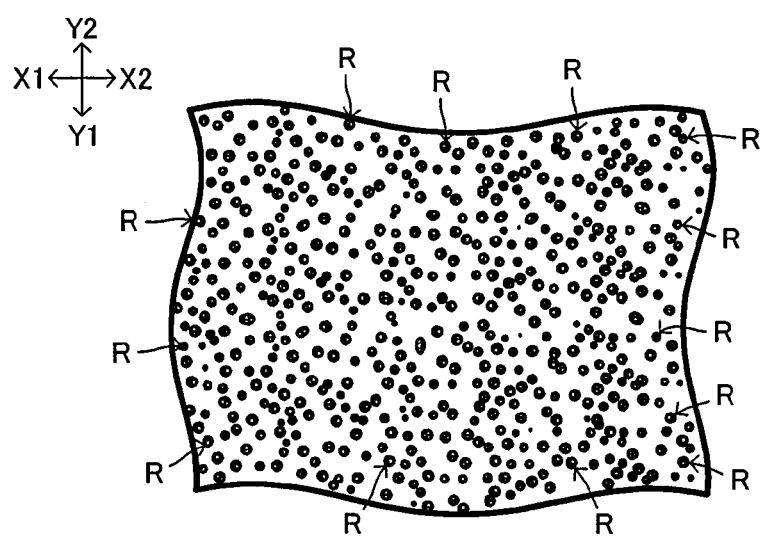
FIG. 3B is a view showing recessed portions (cavities) formed on a surface of the interlayer insulating layer of the wiring board in FIG. 1.

In addition, in the present embodiment, interlayer insulating layers (insulating layers (102, 103, 104)) other than the insulating layer 101, conductive layers on the interlayer insulating layers, and via conductors formed in the interlayer insulating layers have the same structures respectively as those of the insulating layer 101, the conductive layer 110, and the via conductor (101b) as shown in FIGS. 2 to 3B.

In the present embodiment, the insulating layers (101, 102, 103, 104) (each an interlayer insulating layer) do not contain inorganic fiber and are made of a resin containing an inorganic filler. Lack of inorganic fiber in interlayer insulating layers makes it easier to form a thin wiring board 10 with a fine pitch (with high-density wiring). In addition, since the insulating layers (101, 102, 103, 104) are made of a resin containing a high content of an inorganic filler, warping of the wiring board 10 is suppressed.

In addition, by forming the resin layer 1012 in the present embodiment, the inorganic filler contained in each interlayer insulating layer is prevented from making contact with the electroless plated layer formed on the interlayer insulating layer after a roughening treatment. An electroless plated layer has lower adhesion to inorganic filler and may peel off. In a high-density wiring pattern, since the width of wirings is narrow, when a wiring pattern is formed from a pattern resist, a lower electroless plated layer is non-existent and disconnection is thought to occur in the electrolytic plating layer. By contrast, by forming the resin layer 1012 which does not contain an inorganic filler at all or contains only a small amount of the inorganic filler, it is thought that adhesion is improved between the electroless plated layer and the interlayer insulating layer, thus allowing high-density wiring to be formed with excellent connection reliability.

In the present embodiment, the resin layer 1012 contains no inorganic filler at all. For this reason, the inorganic filler contained in each interlayer insulating layer is more surely prevented from making contact with the conductive layers formed on the interlayer insulating layers.

In order to suppress warping of the wiring board 10, it is preferable to make the resin layer 1012 thinner (to make the filler layer 1011 thicker). However, if the resin layer 1012 is too thin, it is harder to form the layer. For that reason, in the present embodiment, it is preferable for the thickness of the resin layer 1012 to be within a range of 0.05 to 1.0 μm, and for a ratio of the resin layer to the insulating layer 101 to be less than 5%. By so setting, it is easier to suppress the warping of the wiring board 10.

In the present embodiment, the filler layer 1011 contains all the inorganic filler contained at a ratio of 50 to 80 wt % in the insulating layer. Thus, even when the interlayer insulating layer does not contain inorganic fiber (base material), the thermal expansion coefficient of the interlayer insulating layer is lowered. As a result, it is easier to suppress the warping of the wiring board 10. In the present embodiment, the thermal expansion coefficient of each interlayer insulating layer (insulating layers (101, 102, 103, 104)) is lower than 30 ppm/K.

In addition, if adhesion is improved between the interlayer insulating layer and the conductor pattern while warping of the wiring board 10 is suppressed, the electrical reliability of the wiring board 10 is thought to be improved as well. Subsequently, the yield of the wiring board 10 is enhanced.

In the following, a method for manufacturing a wiring board 10 according to one embodiment is described.

Figure 4:
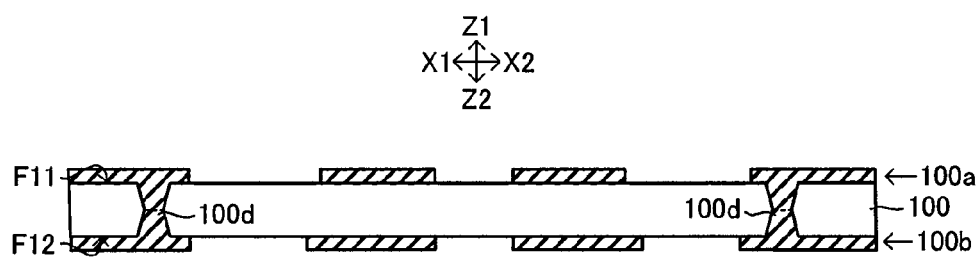
FIG. 4 is a view illustrating a process of preparing a core section in a method for manufacturing a wiring board according to an embodiment of the present invention.

First, as shown in FIG. 4, a core section of the wiring board 10 is prepared. The core section of the wiring board 10 is formed using a double-sided copper-clad laminate or an insulating plate as a starting material, for example. To be more specific, a through hole to form a through-hole conductor (100d) can be formed by, for example, laser processing or drilling. Conductive layers (100a, 100b) and the through-hole conductor (100d) may be formed using any one of the following methods or a combination thereof: panel plating, pattern plating, full additive, semi-additive (SAP), subtractive, transferring and tenting methods.

A substrate 100 is obtained by impregnating glass cloth with an epoxy-based resin containing an inorganic filler (hereinafter, referred to as "glass epoxy"). The epoxy-based resin contains 40 to 70 wt % of the inorganic filler (for example, silica filler).

Next, a buildup section is formed on the core section. In the present embodiment, two sets of interlayer insulating layers and conductive layers (a set of an insulating layer 101 and a conductive layer 110, and another set of an insulating layer 103 and a conductive layer 130) are laminated on a surface (F11) of the substrate 100, and two sets of interlayer insulating layers and conductive layers (a set of an insulating layer 102 and a conductive layer 120 and another set of an insulating layer 104 and a conductive layer 140) are laminated on a surface (F12) of the substrate 100.

Figure 5:
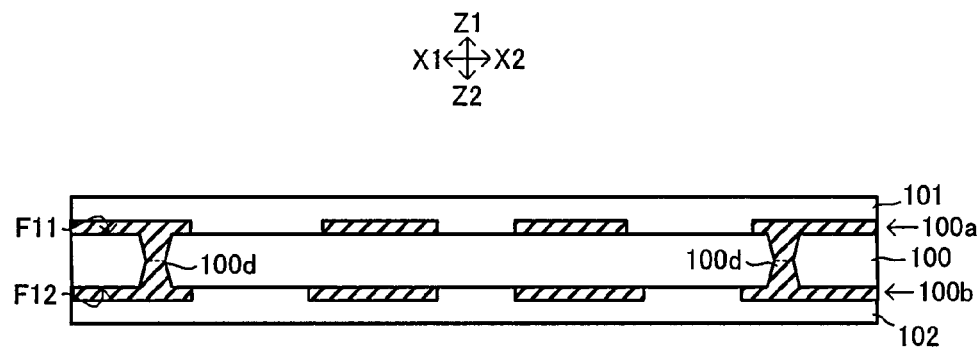
FIG. 5 is a view illustrating a process of forming an interlayer insulating layer on the core section in the method for manufacturing the wiring board according to the embodiment of the present invention.

More specifically, as shown in FIG. 5, a semi-cured (B-stage) insulating layer 101 is coated onto the surface (F11) of the substrate 100 and onto the conductive layer (100a), and a semi-cured (B-stage) insulating layer 102 is coated onto the surface (F12) of the substrate 100 and onto the conductive layer (100b).

As a material of the insulating layers (101, 102), ABF (Ajinomoto Build-up Film made by Ajinomoto Fine Techno Co., Ltd.) may be used, for example. The insulating layers (101, 102) do not contain inorganic fiber, and are made of a resin containing an inorganic filler. In particular, the insulating layers (101, 102) contain an epoxy-based resin, a polymer-based resin, and a curing agent.

Figure 6A:
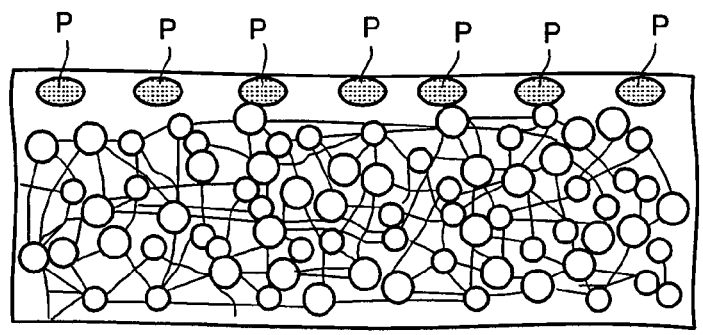
FIG. 6A is a view showing a state of resin used to form the interlayer insulating layer in the method for manufacturing the wiring board according to the embodiment of the present invention.
Figure 6B:
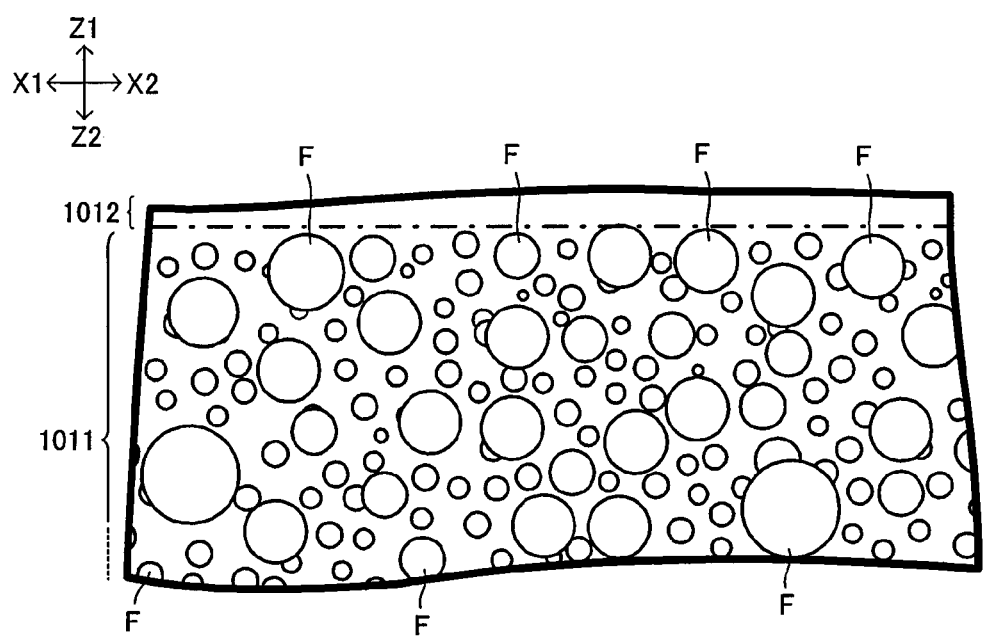
FIG. 6B is a view showing a resin and an inorganic filler of the interlayer insulating layer in the method for manufacturing the wiring board according to the embodiment of the present invention.

In a step of lamination (coating), the insulating layers (101, 102) substantially homogeneously contain the inorganic filler in the entire area thereof, for example. Then, when the insulating layers (101, 102) laminated on the substrate 100 are cured by heating, thermal curing of the resin starts at the time of temperature rise and causes a portion of the uncured resin to be separated, thus producing a resin layer 1012 on a surface portion as shown in FIGS. 6A and 6B. At the time of temperature rise, the epoxy-based resin A and the polymer-based resin A are cured when they are maintained at a certain temperature (TA) for a certain period of time. Meanwhile, the epoxy-based resin B and the polymer-based resin B remain uncured, since they cure at a higher temperature than the epoxy-based resin A and the polymer-based resin A. Accordingly, the uncured epoxy-based resin B and the polymer-based resin B are separated from the epoxy-based resin A and the polymer-based resin A, and thereby form surface layer portions of the insulating layers (101, 102). The inorganic filler is fixed to the epoxy-based resin A and the polymer-based resin A, which are cured. Then, the resin layer 1012 is formed by, for example, raising the temperature from a temperature (TA) to a higher temperature (TB) (temperature TA<temperature TB), and by maintaining the higher temperature for a certain period of time so as to cure the separated epoxy-based resin B and the polymer-based resin B. At this time, the inorganic filler does not exist in the epoxy-based resin B and the polymer-based resin B, which are separated into the surface layer portions of the insulating layers (101, 102). However, when the content of the epoxy-based resin B and the content of the polymer-based resin B in the insulating layer are high, or when a ratio of inorganic filler with a size no greater than 1 μm to the entire inorganic filler contained in the insulating layer is high, that causes high mobility of inorganic filler, and the epoxy-based resin B and the polymer-based resin B, which are uncured and separated from the epoxy-based resin A and the polymer-based resin A to form the surface layer portions of the insulating layers, may contain the inorganic filler. However, the method for forming the resin layer 1012 is not limited to the above.

Next, the surfaces (specifically, the resin layers 1012) of the insulating layers (101, 102) are roughened. To be more specific, only the polymer-based resin (polymer P illustrated in FIG. 6A) among the epoxy-based resins and the polymer-based resins of the insulating layers (101, 102) is selectively etched away. Since a sea-island structure made of the polymer-based resin and the epoxy-based resin is formed in the resin layer 1012, and an etching amount of the polymer-based resin is greater than an etching amount of the epoxy-based resin at the time of roughening treatment, a roughened surface is formed. This roughening treatment produces many recessed portions (cavities) (R) (see FIGS. 3A and 3B) in the surfaces (specifically, resin layers 1012) of the insulating layers (101, 102).

Figure 7:
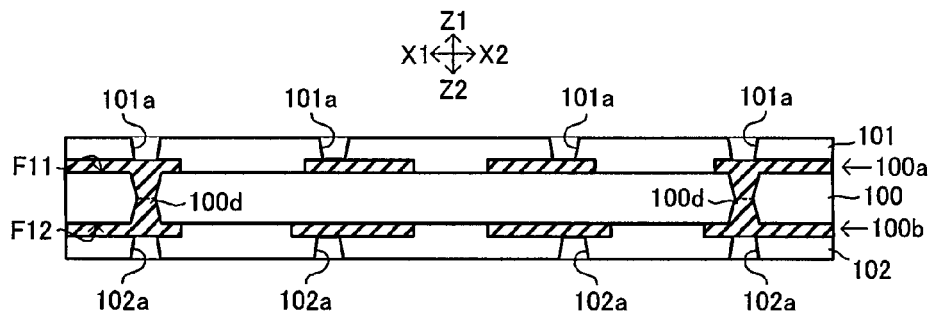
FIG. 7 is a view illustrating a first process of forming a via conductor in the interlayer insulating layer of a lower buildup section and forming a conductive layer on the interlayer insulating layer, in the method for manufacturing the wiring board according to the embodiment of the present invention.

Next, as shown in FIG. 7, via holes (101a) are formed in the insulating layer 101 and via holes (102a) are formed in the insulating layer 102 by using $CO_2$ laser. Then, desmearing is performed if necessary.

Figure 8:
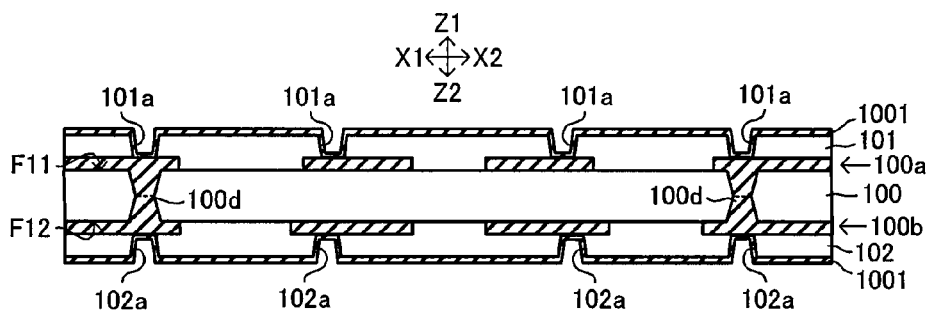
FIG. 8 is a view illustrating a second process subsequent to the process shown in FIG. 7.

Next, as shown in FIG. 8, an electroless copper-plated film 1001 is formed on the insulating layers (101, 102) and inside the via holes (101a, 102a), for example, through a chemical plating process. The electroless plated film 1001 is formed on the resin layers 1012 of the insulating layers (101, 102) (see FIG. 3A). Prior to electroless plating, catalyst made of palladium or the like may be adsorbed onto the surfaces of the insulating layers (101, 102) through an immersion process.

Figure 9:
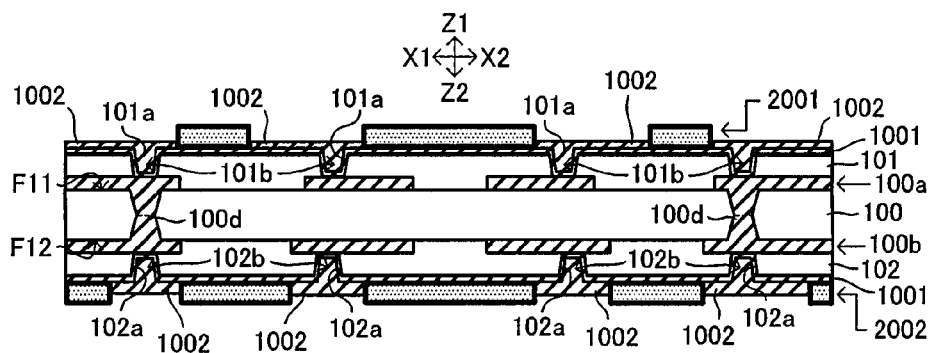
FIG. 9 is a view illustrating a third process subsequent to the process shown in FIG. 8.

Next, as shown in FIG. 9, a plating resist 2001 having openings and a plating resist 2002 having openings are respectively formed on a main surface on the surface (F11) side (on the electroless plating film 1001) and on a main surface on the surface (F12) side (on the electroless plating film 1001), using a lithography technology, a printing process, or the like. The openings of the plating resists (2001, 2002) have patterns corresponding to the conductive layers (110, 120) (refer to FIG. 10), respectively.

Next, as shown in FIG. 9, an electrolytic copper-plating 1002 is formed in the openings of the plating resists (2001, 2002) using a pattern plating method. Electrolytic plating is performed using the electroless plating film 1001 as a seed layer so that copper is deposited on the surface of the electroless plating film 1001. Thus, the via holes (101a, 102a) are filled with the electroless plated film 1001 and the electrolytic plating 1002, forming the via conductors (101b, 102b) made of copper plating, for example.

Figure 10:
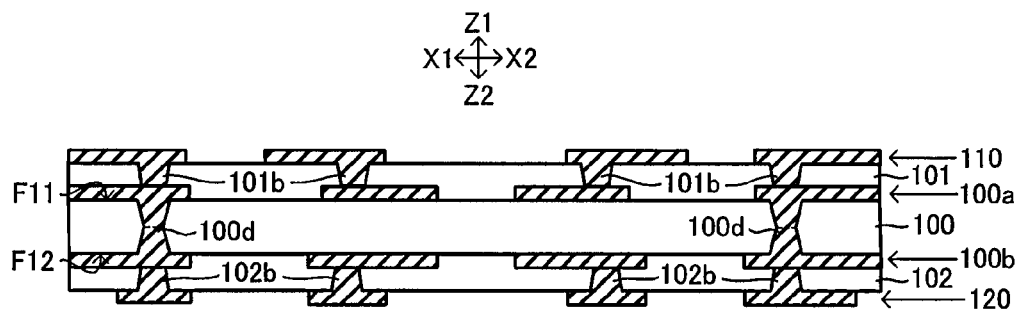
FIG. 10 is a view illustrating a fourth process subsequent to the process shown in FIG. 9.

Then, by removing the plating resists (2001, 2002) and subsequently removing the unnecessary electroless plating film 1001, for example, using a predetermined removing solution, the conductive layer 110 and the conductive layer 120 are formed as shown in FIG. 10. Then, the upper surfaces of the conductive layers (110, 120) are roughened through chemical etching if necessary. In the present embodiment, the conductive layers (110, 120) each have a double-layer structure made up of electroless copper plating (lower layer) and electrolytic copper plating (upper layer), for example. Accordingly, a lower buildup section is completed.

As the seed layer for electrolytic plating, a sputtered film or the like may be used instead of the electroless plating film 1001.

Figure 11:
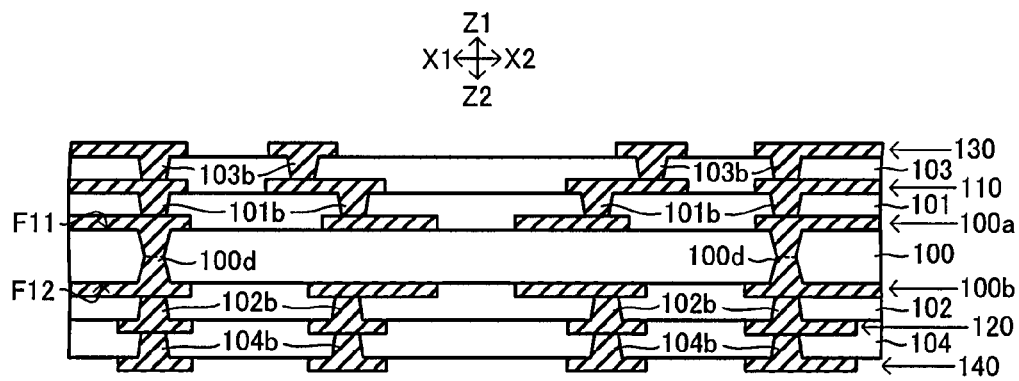
FIG. 11 is a view illustrating a process of forming an upper buildup section, in the method for manufacturing the wiring board according to the embodiment of the present invention.

Next, as shown in FIG. 11, for example, an upper buildup section is formed in the same manner as that for the lower buildup section, for example. Then, a solder-resist layer 11 having openings (11a) and a solder-resist layer 12 having openings (12a) are respectively formed on the conductive layers (130, 140) and the insulating layers (103, 104) (refer to FIG. 1) through screen printing, spray coating, roll coating, laminating, or the like. Furthermore, an anticorrosion layer made of, for example, an Ni/Au film or Ni/Pd/Au film is each formed on the conductive layers (130, 140), more specifically on the surfaces of pads (P1, P2), which are not covered by the solder-resist layer (11 or 12) (see FIG. 1), through electrolytic plating, sputtering, or the like. Alternatively, an anticorrosion layer made of an organic protective film may be formed by performing OSP treatment or Sn plating.

The wiring board 10 (see FIG. 1) of the present embodiment is completed through the above processes. The manufacturing method of the present embodiment is suitable for manufacturing the wiring board 10. An excellent wiring board 10 is obtained at low cost by using the manufacturing method above. Using the above-described method, it is easier to form a thin resin layer 1012.

The present invention is not limited to the above embodiment. For example, it can be implemented according to a modification described below.

According to the above embodiment, the resin layer 1012 contains no inorganic filler at all. However, that is not the only option, and the resin layer 1012 may contain a smaller amount of inorganic filler than that contained in the filler layer 1011. In such a case as well, adhesion is improved between the interlayer insulating layers compared with the case where the resin layer 1012 is not provided.

Regarding the wiring board 10, specifically, its type, properties, size, material, shape, number of layers, positions or the like may be changed within a scope that does not deviate from the gist of the present invention.

For example, in the above embodiment, the conductive layers (100a, 100b) of the core section may be omitted unless necessary.

For example, in the wiring board 10 of the above embodiment, the number of layers of the buildup sections may be changed. Furthermore, the number of layers of the buildup section for the surface (F11) of the substrate 100 may differ from that for the surface (F12) of the substrate 100. However, in order to mitigate stress, the number of layers of the buildup sections for the surface (F11) is preferred to be the same as that for the surface (F12) of the substrate 100 so as to enhance the symmetry of the upper and lower sides. The wiring board 10 may be a single-sided wiring board in which the conductive layer and the interlayer insulating layer are laminated only on one surface of the substrate 100.

Figure 12:
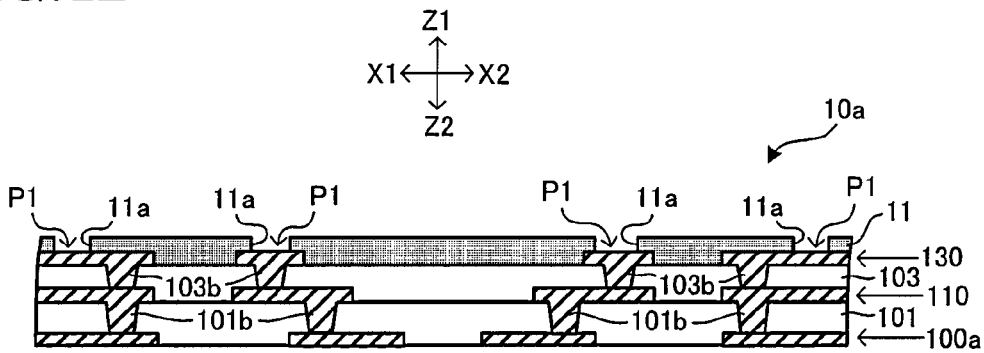
FIG. 12 is a cross-sectional view of a wiring board according to a modified example of the present invention.

For example, the wiring board 10 of the above embodiment is formed to include the substrate 100, which is a core substrate (core section), but as shown in FIG. 12, for example, it is an option for the wiring board to be set as a wiring board (10a) without a core substrate. As shown in FIG. 12, except that it does not have a core substrate, the wiring board (10a) of a modified example is provided with insulating layers, conductive layers, and via conductors, the same as those of the wiring board 10. Thus, the same reference numerals denote the corresponding portions in FIG. 12 and a description thereof is omitted. The coreless substrate shown in FIG. 12 may be manufactured by a method described in JP 2005-101137 A, for example. The entire contents of this publication are incorporated herein by reference.

The manufacturing method of the wiring board is not limited to the order and contents described in the above embodiment, and the order and contents may be changed as long as they stay within a scope that does not deviate from the gist of the present invention. Some processes may be omitted depending on usage purposes or the like.

The above-described embodiment and modified examples (materials for each element or the like) may be combined freely. It is preferable to select a suitable combination according to use or the like.

When an interlayer insulating layer does not contain inorganic fiber, a thermal expansion coefficient of the interlayer insulating layer is high, thus causing a thin wiring board to warp. To set a thermal expansion coefficient of the interlayer insulating layer to be the same as that of a core substrate, which is made of inorganic fiber and resin and has a low thermal expansion coefficient, the content of the inorganic filler may be increased. However, when the content of the inorganic filler is increased, an area of the inorganic filler exposed on the surface of the interlayer insulating layer increases as well, and adhesion to an electroless plated film formed on the surface decreases after a roughening treatment is performed. Accordingly, a high-density conductive pattern is hard to form and connection reliability is lowered.

A wiring board according to an embodiment of the present invention includes a core section made of a core substrate, and a buildup section formed by laminating on the core section at least one set of an interlayer insulating layer and a conductive layer. In such a wiring board, a first insulating layer as one of the interlayer insulating layers does not contain inorganic fiber and is made of a resin that contains an inorganic filler; and the inorganic filler is not in contact with a first conductive layer formed on the first insulating layer.

A wiring board according to another embodiment of the present invention includes an insulating layer having a first surface and a second surface opposite the first surface, a first conductive layer formed on the first surface of the insulating layer, a second conductive layer formed on the second surface of the insulating layer, and a via conductor penetrating through the insulating layer to connect the first conductive layer and the second conductive layer. The insulating layer does not contain inorganic fiber and is made of a resin containing an inorganic filler, and the inorganic filler does not make contact with the first conductive layer.

A method for manufacturing a wiring board according to yet another embodiment of the present invention includes forming a core section made of a core substrate, and forming a buildup section on the core section by laminating at least one set of an interlayer insulating layer and a conductive layer. Forming the buildup section includes forming an insulating layer that does not contain inorganic fiber and is made of a resin containing an inorganic filler, setting the inorganic filler to be non-existent in the vicinity of a surface portion of the insulating layer, and forming a conductive layer on the surface of the insulating layer.

According to an embodiment of the present invention, adhesion is improved between an interlayer insulating layer and a conductor pattern while warping of a wiring board is suppressed. Furthermore, in addition to or instead of such effects, electrical reliability of a wiring board is likely to be enhanced according to the present invention. Yet furthermore, according to the present invention, in addition to or instead of the above effects, the yield of a wiring board is likely to be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a core structure comprising a core substrate; and
   a buildup structure formed on the core structure and comprising an interlayer insulating layer and a conductive layer,
   wherein the interlayer insulating layer does not contain inorganic fiber and comprises a resin component and an inorganic filler such that the interlayer insulating layer comprises a filler layer including the inorganic filler and a resin layer formed on the filler layer and that the inorganic filler is not exposed on a surface of the resin layer, the conductive layer is formed on the interlayer insulating layer such that the conductive layer is formed on the surface of the resin layer and is not in contact with the inorganic filler in the interlayer insulating layer, and the resin layer of the interlayer insulating layer does not contain the inorganic filler or includes the inorganic filler such that the filler layer of the interlayer insulating layer includes the inorganic filler in an amount which is greater than an amount of the inorganic filler in the resin layer of the interlayer insulating layer.

2. The wiring board according to claim 1, wherein the core structure comprises a core substrate and a conductive layer formed on a surface of the core substrate, and the interlayer insulating layer is formed on the surface of the core substrate such that the interlayer insulating layer is covering the conductive layer of the core structure.

3. The wiring board according to claim 2, wherein the resin layer of the interlayer insulating layer has a thickness which is in a range of 0.05 μm to 1.0 μm.

4. The wiring board according to claim 1, wherein the interlayer insulating layer includes the inorganic filler such that an amount of the inorganic filler in the interlayer insulating layer a range of 50 wt % to 80 wt %.

5. The wiring board according to claim 1, wherein the filler layer of the interlayer insulating layer has a thickness which is greater than a thickness of the resin layer of the interlayer insulating layer, and the interlayer insulating layer comprises the resin component an epoxy-based resin and a polymer-based resin and has the surface of the resin layer such that the surface has a roughened surface formed by selectively etching the polymer-based resin.

6. The wiring board according to claim 2, wherein the interlayer insulating layer includes the inorganic filler such that an amount of the inorganic filler in the interlayer insulating layer is in a range of 50 wt % to 80 wt %.

7. The wiring board according to claim 3, wherein the interlayer insulating layer includes the inorganic filler such that an amount of the inorganic filler in the interlayer insulating layer is in a range of 50 wt % to 80 wt %.

8. A wiring board, comprising: an insulating layer;
   a first conductive layer formed on a first surface of the insulating layer; a second conductive layer formed on a second surface of the insulating layer on an opposite side of the insulating layer with respect to the first surface; and
   a via conductor structure formed through the insulating layer such that the via conductor structure is connecting the first conductive layer and the second conductive layer,
   wherein the insulating layer does not contain inorganic fiber and comprises a resin component and an inorganic filler such that the insulating layer comprises a filler layer including the inorganic filler and a resin layer formed on the filler layer and that the inorganic filler is not exposed on a surface of the resin layer, the first conductive layer is formed on the insulating layer such that the first conductive layer is formed on the surface of the resin layer and is not in contact with the inorganic filler in the insulating layer, and the resin layer of the insulating layer does not contain the inorganic filler or includes the inorganic filler such that the filler layer of the insulating layer includes the inorganic filler in an amount which is greater than an amount of the inorganic filler in the resin layer of the insulating layer.

9. The wiring hoard according to claim 8, wherein the insulating layer is formed such that the insulating layer is covering the second conductive layer.

10. The wiring board according to claim 9, wherein the resin layer of the insulating layer has a thickness which is in a range of 0.05 μm to 1.0 μm.

11. The wiring board according to claim 8, wherein the insulating layer includes the inorganic filler such that an amount of the inorganic filler in the insulating layer is in a range of 50 wt % to 80 wt %.

12. The wiring board according to claim 8, wherein the filler layer of the interlayer insulating layer has a thickness which is greater than a thickness of the resin layer of the interlayer insulating layer, and the interlayer insulating layer comprises the resin component an epoxy-based resin and a polymer-based resin and has the surface of the resin layer such that the surface has a roughened surface formed by selectively etching the polymer-based resin.

13. The wiring board according to claim 9, wherein the insulating layer includes the inorganic filler such that an amount of the inorganic filler in the insulating layer is in a range of 50 wt % to 80 wt %.

14. The wiring board according to claim 10, wherein the insulating layer includes the inorganic filler such that an amount of the inorganic filler in the insulating layer is in a range of 50 wt % to 80 wt %.

15. A method for manufacturing a wiring board, comprising:
forming a core structure comprising a core substrate; and
forming on the core structure a buildup structure comprising an interlayer insulating layer and a conductive layer,
wherein the forming of the buildup structure includes forming the interlayer insulating layer which does not contain inorganic fiber and comprises a resin component and an inorganic filler such that the interlayer insulating layer comprises a filler layer including the inorganic filler and a resin layer formed on the filler layer and that the inorganic filler is not exposed on a surface of the resin layer, and forming the conductive layer on a surface of the interlayer insulating layer such that the conductive layer is formed on the surface of the resin layer and is not in contact with the inorganic filler in the interlayer insulating layer, and the forming of the resin layer comprises forming the resin layer which does not contain the inorganic filler or the forming of the interlayer insulating layer comprises forming the filler layer and the resin layer which includes the inorganic filler such that the filler layer includes the inorganic filler in an amount which is greater than an amount of the inorganic filler in the resin layer.

16. The method according to claim 15, wherein the forming of the core structure comprises forming a conductive layer on a surface of a core substrate, and the forming of the buildup structure comprises forming the interlayer insulating layer on the surface of the core substrate such that the interlayer insulating layer covers the conductive layer of the core structure.

17. The method according to claim 16, wherein the forming of the resin layer comprises forming the resin layer such that the resin layer has a thickness which is in a range of 0.05 μm to 1.0 μm.

18. The method according to claim 15, wherein the forming of the interlayer insulating layer comprises forming the interlayer insulating layer such that the interlayer insulating layer includes the inorganic filler in an amount n a range of 50 wt % to 80 wt %.

19. The method according to claim 16, wherein the forming of the interlayer insulating layer comprises forming the interlayer insulating layer such that the interlayer insulating layer includes the inorganic filler in an amount in a range of 50 wt % to 80 wt %.

20. The method according to claim 17, wherein the forming of the interlayer insulating layer comprises forming the interlayer insulating layer such that the interlayer insulating layer includes the inorganic filler in an amount in a range of 50 wt % to 80 wt %.

* * * * *